US009685929B2

(12) United States Patent
Arcamone et al.

(10) Patent No.: US 9,685,929 B2
(45) Date of Patent: Jun. 20, 2017

(54) MEMS/NEMS DEVICE COMPRISING A NETWORK OF ELECTROSTATICALLY ACTUATED RESONATORS AND HAVING AN ADJUSTABLE FREQUENCY RESPONSE, NOTABLY FOR A BAND-PASS FILTER

(71) Applicant: COMMISSARIAT A L'ENERGIE ATOMIQUE ET AUX ENERGIES ALTERNATIVES, Paris (FR)

(72) Inventors: Julien Arcamone, Grenoble (FR); Gregory Arndt, Meylan (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/533,909

(22) Filed: Nov. 5, 2014

(65) Prior Publication Data
US 2015/0123745 A1    May 7, 2015

(30) Foreign Application Priority Data

Nov. 6, 2013 (FR) ..................... 13 60855

(51) Int. Cl.
| H03H 9/02 | (2006.01) |
|---|---|
| H03H 9/46 | (2006.01) |
| H03H 9/52 | (2006.01) |

(52) U.S. Cl.
CPC .... *H03H 9/02259* (2013.01); *H03H 9/02393* (2013.01); *H03H 9/462* (2013.01); *H03H 9/525* (2013.01); *H03H 2009/02291* (2013.01)

(58) Field of Classification Search
CPC .......................... H03H 9/02259; H03H 9/462
(Continued)

(56) References Cited

U.S. PATENT DOCUMENTS

| 7,696,843 B2 * | 4/2010 | Hashimura ............ B82Y 10/00 |
| | | 333/186 |
| 2007/0089519 A1 * | 4/2007 | Hao ........................ G01H 11/08 |
| | | 73/649 |

(Continued)

FOREIGN PATENT DOCUMENTS

| EP | 2197106 A1 | 6/2010 |
| FR | 2917731 A1 | 12/2008 |

(Continued)

OTHER PUBLICATIONS

Ville-Kaajakari et al., Square-Extensional Mode Single-Crystal Silicon Micromechanical RF-resonator, Jun. 2003, IEEE, 4 pages.*

(Continued)

*Primary Examiner* — Dean Takaoka
(74) *Attorney, Agent, or Firm* — Baker Hostetler LLP (57) ABSTRACT

A MEMS/NEMS device having an adjustable frequency response comprises an array of electrostatically actuated resonators, an electrostatic actuation circuit, electrical detection means, and means adjusting the frequency response of the resonators. The device comprises resonators having a movable portion, electrically connected in series between a first biasing potential $V_B$ and a second biasing potential $V_{B2}$, each resonator biased to a potential Vi between $V_B$ and $V_{B2}$, depending on position in the series. The electrostatic actuation circuit comprises, for each resonator, an actuation electrode facing the movable portion, all electrodes being connected in parallel to a common control potential $V_{IN}$, the actuation voltage of each resonator being equal to $V_{IN}$–Vi. The detection means comprises a detection output common to all resonators, the output being connected to an output potential $V_{out}$. The means for adjusting the frequency response varies the common control potential and/or at least one of the biasing potentials.

13 Claims, 7 Drawing Sheets

(58) Field of Classification Search
USPC .................. 333/186, 197, 199; 310/366, 368
See application file for complete search history.

(56) References Cited

U.S. PATENT DOCUMENTS

| | | |
|---|---|---|
| 2010/0141355 A1 | 6/2010 | Kharrat et al. |
| 2010/0171570 A1* | 7/2010 | Chandrahalim ..... H03H 9/2436 333/186 |
| 2011/0128095 A1 | 6/2011 | Kharrat et al. |
| 2014/0013848 A1 | 1/2014 | Colinet et al. |

FOREIGN PATENT DOCUMENTS

| | | |
|---|---|---|
| FR | 2929775 A1 | 10/2009 |
| FR | 2973504 A1 | 10/2012 |

OTHER PUBLICATIONS

E. Sage, et al., "Frequency-Addressed Nems Arrays for Mass and Gas Sensing Applications", 2013 Transducers & Eurosensors XXVII: The 17th International Conference on Solid-State Sensors, Actuators and Microsystems, Jun. 16, 2013, pp. 655-668, IEEE, XP032499609.

Julien Arcamone, et al., "Efficient Capacitive Transduction of High-Frequency Micromechanical Resonators by Intrinsic Cancellation of Parasitic Feed Through Capacitances", Applied Physics Letters 97, 2010, pp. 043505-1 thru 043505-3, American Institute of Physics.

* cited by examiner

MEMS/NEMS DEVICE COMPRISING A NETWORK OF ELECTROSTATICALLY ACTUATED RESONATORS AND HAVING AN ADJUSTABLE FREQUENCY RESPONSE, NOTABLY FOR A BAND-PASS FILTER

CROSS-REFERENCE TO RELATED APPLICATION

This application claims priority to foreign French patent application No. FR 1360855, filed on Nov. 6, 2013, the disclosure of which is incorporated by reference in its entirety.

FIELD OF THE INVENTION

The field of the invention is that of radio-frequency components (for filtering in particular) and notably that of sensors based on resonators (applied to sensors of variations in resonant frequency such as mass or gas sensors in particular).

BACKGROUND

Generally, the microsystems designated MEMS and/or NEMS, for micro and/or nanoelectromechanical systems, are components fabricated by means of microelectronics fabrication processes and certain dimensions of which may range from a few tens of nanometers to a few hundred microns.

A great deal of research has been carried out on these components because they allow functionalities (sensors or actuators) to be obtained that were difficult to obtain with "conventional" microelectronic components, or achieve a comparatively better performance. For example, acceleration or pressure sensors have already been commercialized and used in many applications (cars, video games, mobile phones).

Radio-frequency (RF) components represent another field of application of MEMS. Mention may be made offhand of SAW or BAW resonators for filtering applications in the acquisition or receiver chain of an RF communications module. Such components have already been commercialized, as have high-frequency MEMS resonators implemented in time bases of electronic circuits.

One of the objectives of RF communication is to design communication modules that may have their frequency adjusted. In other words, the operating frequency of the communication module may be adjusted in order to comply with various communication standards.

Electrostatically actuated resonators are one potential solution for producing adjustable filters, which are the basic building blocks of adjustable communication modules.

Examples of filters produced using networks of resonators are already known—see patent application FR 2 929 775. In this patent application the dispersion in resonant frequency due to manufacturing process variability is used to produce a band-pass filter, the pass band of which is thus set by dimensional variations induced by technological dispersion between nominally identical resonators. This type of configuration therefore relies on technological dispersion, which is random and uncontrollable.

Patent application EP 2 197 106 for its part describes a MEMS/NEMS device comprising resonators electrically connected in series, but these resonators are addressed individually at a potential Vi. There are therefore as many actuation voltages as there are resonators. Such an n-resonator device requires n+2 regulating voltages [Ve, Vi (with i ranging from 1 to n), Vdc], which may be particularly disadvantageous in the case of a network comprising many resonators.

SUMMARY OF THE INVENTION

This is why, in this context, one subject of the present invention is a MEMS/NEMS device allowing dispersion in resonant frequency to be controlled in order to adjust the overall frequency response of a device using a network of resonators and of simplified design.

More precisely, one subject of the present invention is a MEMS/NEMS device having an adjustable frequency response and comprising an array of electrostatically actuated resonators, an electrostatic actuation circuit for actuating said resonators, electrical detection means, and means for adjusting the frequency response of all of said resonators, characterized in that:

said device comprises at least one network of n resonators having a movable portion, said n resonators being electrically connected in series between a first biasing potential $V_B$ and a second biasing potential $V_{B2}$, each ith resonator being biased to a potential Vi comprised between said potential $V_B$ and said potential $V_{B2}$, depending on its position in the series;

said electrostatic actuation circuit for actuating said resonators comprises, for each resonator, an actuation electrode facing said movable portion of the resonator, all of said actuation electrodes being connected in parallel to a common control potential $V_{IN}$, the actuation voltage of each ith resonator being equal to $V_{IN}$–Vi;

said detection means comprises a detection output common to said n resonators, said output being connected to an output potential $V_{out}$; and said means for adjusting the frequency response varies said common control potential and/or at least one of the biasing potentials.

Thus, the device of the present invention makes it possible to use only three regulating voltages ($V_B$, $V_{B2}$, $V_{IN}$), the potentials Vi of the resonators ensuing from the voltages $V_B$ and $V_{B2}$ and their position in the series of resonators. The invention therefore makes it possible to obtain a simplified device having far fewer regulating parameters than in the prior art consisting of patent application EP 2 197 106, and not requiring mechanical coupling; such simplicity makes it possible to improve the reliability of the system and its implementation and even to increase its integration density.

When a resonator is said to be biased at a potential Vi, said potential Vi corresponds to an average bias value comprised between Vi and Vi−1, corresponding to the values of the potentials of the nodes on either side of the ith resonator.

According to one variant of the invention, the detection means are capacitive detection means comprising a set of detection electrodes coupled to the n resonators, said detection electrodes being connected to said output potential $V_{out}$.

According to one variant of the invention, the detection means are piezoresistive detection means, of the resistivity of the array of n resonators connected in series.

According to one variant of the invention, the second biasing potential $V_{B2}$ being zero, the output potential has a nonzero value lower than that of the first biasing potential, the resonators being mounted in series with a resistor of resistance equal to n times that of a single resonator.

According to one variant of the invention, the resonators are cantilever beams.

According to one variant of the invention, the resonators are fixed-end beams.

According to one variant of the invention, the resonators are plate resonators.

The expression "plate resonator" is understood to mean a resonator having any shape in a principal plane: square, rectangular, annular, oval disc, etc.

According to one variant of the invention, the device comprises pairs of actuation electrodes and pairs of detection electrodes that are coupled to each plate resonator, each plate resonator being able to be actuated in a Lamé mode. The Lamé mode is preferred but other modes such as for example an extensional mode may be used.

According to one variant of the invention, the n resonators have a stiffness and a gap with the associated actuation electrode, defining a DC actuation voltage for each resonator that is approximated by the value $V_{DC}(i)=V_{IN\ DC}-Vi$ (i being the index of the resonator in the chain) such that the average of all the actuation voltages $M\ [V_{DC}(i)]$, with i varying from 1 to n, is substantially equal to the value $n\times\sigma[V_{DC}(i)]$, where $\sigma[V_{DC}(i)]$ is the standard deviation of said voltages.

It will be noted that this approximation may be made for large numbers, if not the following approximation may be used:

$$V_{DC}(i)=V_{IN\ DC}-V_{B2}-(2n-2i+1)/(V_B-V_{B2})/2n \text{ where } V_B \text{ and } V_{B2} \text{ are the first and second potentials.}$$

According to one variant of the invention, the n resonators have identical or almost identical geometrical dimensions.

Another subject of the invention is an RF filter having an adjustable frequency response and comprising a MEMS/NEMS device according to the invention.

Yet another subject of the invention is a sensor for detecting frequency variations and comprising a MEMS/NEMS device according to the invention. The sensor may notably be a mass sensor or indeed even a gas sensor.

BRIEF DESCRIPTION OF THE DRAWINGS

The invention will be better understood and other advantages will become apparent on reading the following description given by way of nonlimiting example and by virtue of the appended figures, in which.

DETAILED DESCRIPTION

Generally, the device of the present invention comprises at least one linear network of resonators the actuation mode of which is electrostatic. The detection mode may for its part vary, it may notably be capacitive or piezoresistive. The device of the present invention will be described below in the context of a single network, but could also just as well comprise an array of linear networks.

A few general notions regarding MEMS resonators are recalled below.

A MEMS resonator is an electromechanical device made up of a movable portion (vibrating mechanical structure) and may comprise two electromechanical transducers: a first actuation transducer and a second detection transducer. The first transducer, in order to actuate the structure, generates a force on the movable portion thus making it move. The second transducer allows the mechanical movement of said movable portion to be electrically detected. The most common actuation transductions are electrostatic, magnetic, thermomechanical and piezoelectric actuation transductions. Generally, the most common detection techniques are capacitive, piezoresistive, magnetomotive and piezoelectric detection techniques.

The term "resonator" is used because the transfer function defined between the force exerted on the movable mechanical portion and the movement of the latter, calculated using the equation of movement of the system, has a frequency behaviour defined mathematically by a Lorentzian function. The mechanical structure is therefore mainly defined by its natural resonant frequency $f_0$ and by its quality factor Q.

An advantageous property of electrostatic actuation is that the DC potential difference $V_{DC}$ between the resonator and the actuation electrode modifies the resonant frequency $f_R$ of the MEMS and tends to decrease it according to the relationship $f_R=f_0(1-\alpha V_{DC}^2)$, $\alpha$ being a positive coefficient. This effect of decreasing the stiffness of the resonator, which has the effect of decreasing its resonant frequency, is known in the literature as the spring-softening effect. It will be noted that similar effects have been demonstrated in the literature for other actuation types but the dependence between the voltage $V_{DC}$ and the frequency $f_R$ is weaker.

Figure 1:
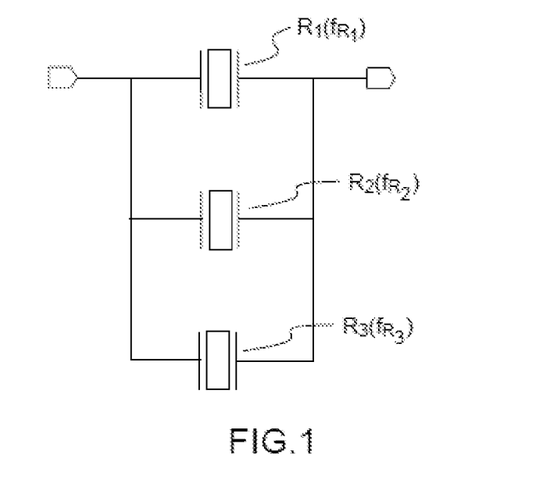
FIG. 1 illustrates a diagram of a network of 3 resonators mounted in parallel according to the prior art.

When a network is formed from resonators connected in parallel (actuation electrodes all interconnected, likewise for the detection electrodes, these interconnections being made on or off chip), each resonator having a different resonant frequency, as shown in FIG. 1 for the case of three resonators $R1(f_{R1})$, $R2(f_{R2})$ and $R3(f_{R3})$ arranged in parallel, the same actuation signal is applied simultaneously to all the resonators of the network.

The signals resulting from each MEMS are then summed, either by the network itself (all the detection electrodes of the resonators are interconnected by a common track connected to a single output pad), or external to the chip (interconnection of wires connected to each detection electrode), this solution being less practical.

Figure 2:
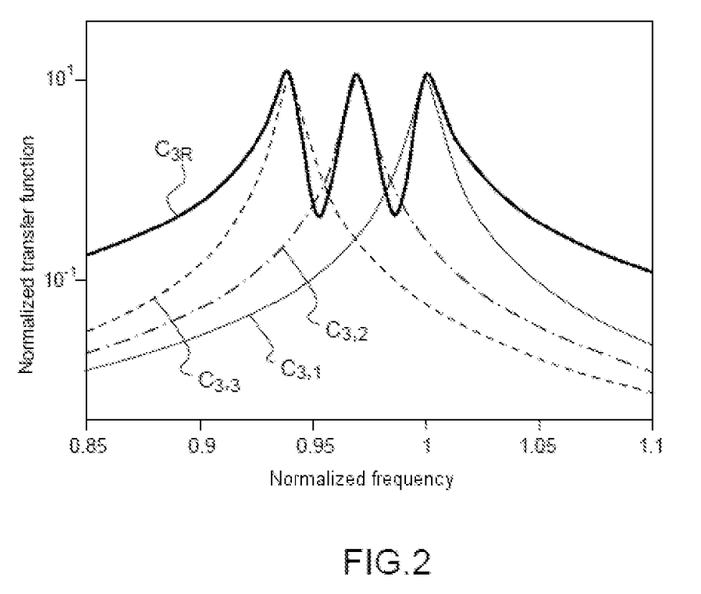
FIG. 2 illustrates the response of a network of 3 MEMS resonators arranged in parallel and having a natural resonant frequency dispersion of 3%.

In the present case of a network of 3 resonators mounted in parallel, the curve $C_{3R}$ in FIG. 2 shows the transfer function of the network of 3 MEMS resonators with a natural resonant frequency dispersion of 3% (in this example, the quality factor of each MEMS is 100). The resonant frequencies are normalized relative to the 1st MEMS, thus the resonant frequency of the 1st MEMS is equal to 1, that of the 2nd is equal to 0.97 and that of the 3rd is equal to 0.94. The individual transfer functions of each MEMS are also shown by the curves $C_{3,1}$, $C_{3,2}$ and $C_{3,3}$. It may be seen that the transfer function of the network contains ripples about the resonant frequencies of each MEMS.

Figure 3:
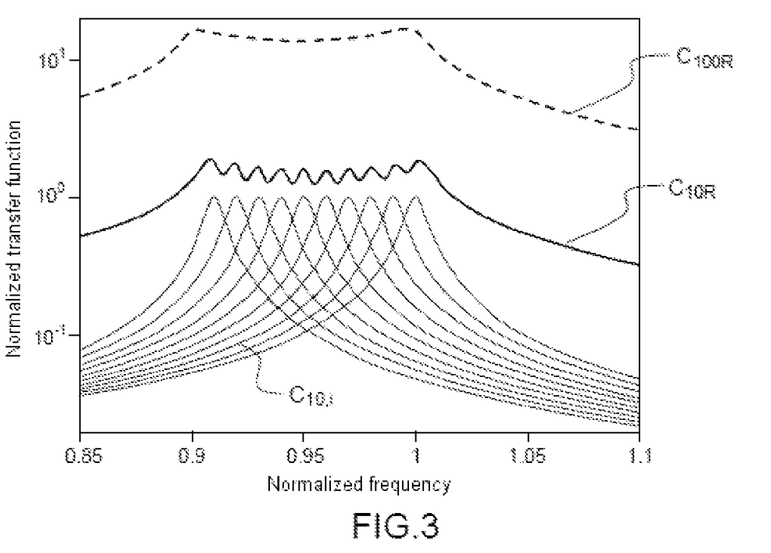
FIG. 3 illustrates the response of a network of 10 MEMS resonators arranged in parallel and having a natural resonant frequency dispersion of 1% and the response of a network of 100 MEMS resonators arranged in parallel and having a natural resonant frequency dispersion of 0.1%.

The case of a network of 10 MEMS with a natural resonant frequency dispersion of 1% is likewise illustrated in FIG. 3 and is more significant. The ripples about the natural resonant frequencies of each MEMS are smaller and the transfer function of the network is similar to that of a band-pass filter. The transfer function of the network of 10 MEMS is illustrated by the curve $C_{10R}$, the individual transfer functions are illustrated by the curves $C_{10,i}$.

The transfer function of a network of 100 MEMS (with a natural resonant frequency dispersion of 0.1%) has been added and is illustrated by the dotted curve $C_{100R}$. It may be seen that the curve does not ripple and describes a behaviour very similar to that of a band-pass filter.

Thus, FIGS. 2 and 3 demonstrate that it is possible to produce a band-pass filter by means of a network of a large number of resonators. It will be noted that in these examples, the dispersion in the natural resonant frequencies $f_0$ defines the width of the passband of the filter.

Figure 4:
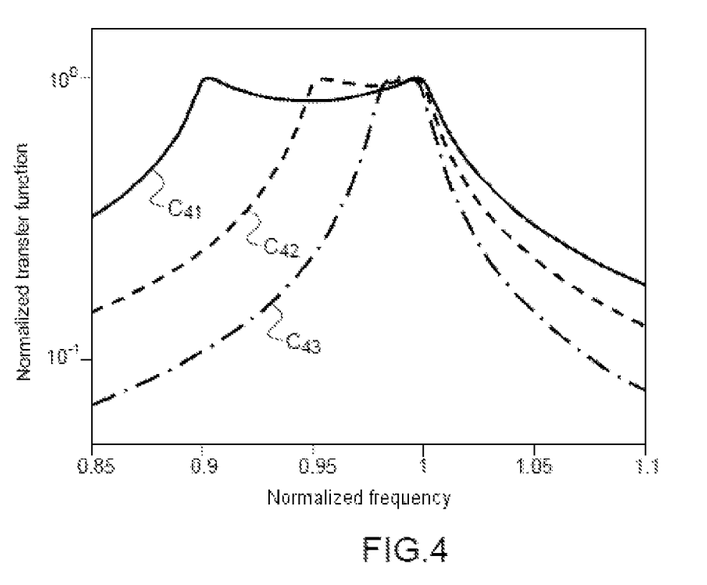
FIG. 4 illustrates the response of a network of 100 MEMS for various dispersions in resonant frequency.

If, moreover, the resonant frequencies of each MEMS may be adjusted in one way or another, it is then possible to control the passband of the filter. FIG. 4 illustrates the latter proposition: the transfer functions of 3 MEMS networks are shown in this Figure for 3 values of frequency dispersion (curve $C_{41}$: $\Delta f_R$=0.1%, curve $C_{42}$: $\Delta f_R$=0.05% and curve $C_{43}$: $\Delta f_R$=0.02%).

The objective of the present invention is to control resonant frequency dispersions in order to adjust the overall frequency response of the network. Rather than mainly acting on the natural resonant frequencies $f_0$ of the resonators (which depend on the materials used and the geometrical dimensions of the resonators), it is proposed to adjust resonant frequency $f_R$ via the DC potential difference $V_{DC}$ applied between the resonator and the actuation electrode by way of the spring-softening effect.

Thus, the invention relates to a device comprising a network of electrostatically actuated MEMS resonators having an adjustable frequency response, one of the mainly targeted applications of which is to a band-pass filter function having an adjustable central frequency and passband.

More precisely, the main operating features of the device of the invention with its network of n resonators and of the actuation electrodes of said resonators are the following:

by applying to a common input, an actuation voltage $V_{IN\_AC}$ (AC portion)+$V_{IN\_DC}$ (DC portion), the actuation being achieved by electrostatic force, all the resonators are simultaneously actuated with the same signal;

by delivering a single output, carrying the electromechanical detection signal of the array of resonators of the network, via the fact that:

for resonators employing capacitive detection, in 3-port mode all the detection electrodes are interconnected, or in 2-port mode all the resonators are interconnected; and for resonators employing piezoresistive detection, all the resonators are interconnected.

Whatever the detection mode, the resonators are electrically arranged in series, so that the electrical end of this chain is set to a certain reference potential $V_B$, the other end being set to a reference potential $V_{B2}$ (ground in most of the following figures, but any other value is possible).

If each resonator is numbered with an index i ranging from 1 to n from the end set to $V_B$ to the other end, and $V_i$ is the potential of the node between the resonator $R_{i-1}$ and the resonator $R_i$, the value of $V_i$ follows the relationship:

$$V_i = (n-i)/n(V_B - V_{B2}).$$

Therefore, the DC potential difference $V_{DC}$ between the resonator and the actuation electrode is different at each and every point in the chain, one end of which is at $V_B$ and the other end of which is at $V_{B2}$.

This, by extension, means that each resonator is actuated by a DC actuation voltage $V_{DC}$ that is specific to it, that is designated $V_{DC}(i)$ and that may be approximated, as explained above, by the equation:

$$V_{DC}(i) = V_{IN\_DC} - V_i.$$

If the resonators of the network are all identical in terms of their dimensions, the size of the gap g and the dimensions of their electrodes, then they will all have a different resonant frequency due to the spring-softening effect (although they have an identical natural frequency $f_0$), which mathematically results in the relationship:

$$f_{Ri} = f_0[1 - C_0 V_{DC}^2(i)/(kg^2)]$$

k being the stiffness (in N/m) of the resonators and $C_0$ the static capacitance between the resonator and its actuation electrode. It will be noted that no mechanical coupling is required between the resonators.

Typically, the voltage $V_{B2}$ may be equal to 0.

Thus, by varying the potential $V_{IN\_DC}$ and the potential $V_B$, it is possible to influence the potential $V_{DC}(i)$ and therefore vary the resonant frequencies $f_{Ri}$.

In this way, it is possible to influence the frequency response of the network which may then take a number of forms:

a response in the form of a single peak (the frequencies $f_{Ri}$ are very close to one another, the individual peaks summing);

the opposite being a comb-shaped response, each peak being clearly defined and potentially having a different amplitude; and the intermediate response, this response being the most suitable for producing the band-pass filter function, this response being of the type shown in FIGS. 3 and 4.

Those skilled in the art will be able, by analytical simulation (based on the electromechanical behaviour of the resonators and on the electrical diagram of the network) or by computer-aided design (CAD), to model effectively this system and choose the operating points $V_{IN\_DC}$ and $V_B$ necessary to obtain the regime of their choice from the three described above.

If $M[V_{DC}(i)] = (\Sigma_{i=1}^n V_{DC}(i))/n$ is the average over i of the values of $V_{DC}(i)$, and $\sigma[V_{DC}(i)]$ is the standard deviation of the values of $V_{DC}(i)$, the behaviour of the frequency response of the network thus formed, which most particularly depends on the type of resonator (on its stiffness k inter alia) and on its gap, may be generalized as follows:

for $M[V_{DC}(i)] \gg \sigma[V_{DC}(i)]$, the dispersion of the resonant frequencies becomes negligible and a response having the form of a single peak is obtained;

for $M[V_{DC}(i)] \ll \sigma[V_{DC}(i)]$, the resonant frequencies vary substantially and the peaks are all separated; and for $M[V_{DC}(i)] \approx n \times \sigma[V_{DC}(i)]$, the resonant frequencies do indeed vary notably but by adjusting $V_{IN\_DC}$ depending on $V_B$ it is possible to obtain a band-pass filter type response.

The latter situation is that on which the Applicant has most particularly concentrated.

In contrast to the solutions of the prior art and notably that described in patent application FR 2 929 775, in which technological dispersion, which is random and uncontrollable, is used to obtain different frequencies for each resonator, the present invention allows the central frequency and the passband of the filter obtained to be adjusted when the system is configured to obtain a band-pass filter type response.

This concept is potentially applicable to any type of mechanical resonator.

The resonators may all have different dimensions and a different sized gap, but in a preferred embodiment it is more simple, notably in terms of modelling, for the resonators to all be identical.

As mentioned above, the main way in which the present invention is used is to obtain a band-pass filter having an adjustable central frequency and passband. However, the present invention may also facilitate implementation of the measuring method described in patent application FR 2 973 504 or in the article by E. Sage, O. Martin, C. Dupré, T. Ernst, G. Billiot, L. Duraffourg, E. Colinet, and S. Hentz, "FREQUENCY-ADDRESSED NEMS ARRAYS FOR MASS AND GAS SENSING APPLICATIONS", in the proceedings of the IEEE Transducers conference 2013, which relate to a method for measuring a network of resonators for mass or gas sensing applications. The implementation of this method requires the resonant frequencies of all the resonators of the network to be different, which is obtained in the publication "FREQUENCY-ADDRESSED NEMS ARRAYS FOR MASS AND GAS SENSING APPLICATIONS" by the fact that the resonators all have different geometrical dimensions (in actual fact a different length).

By virtue of the solution presented in the present invention described here, it is possible to ensure that the resonant frequencies of the resonators of the network are all different, while having the same dimensions, allowing frequency intervals to be adjusted on demand.

This property may also advantageously allow mass or gas sensors to be produced.

First Example Device According to the Invention

Figure 5:
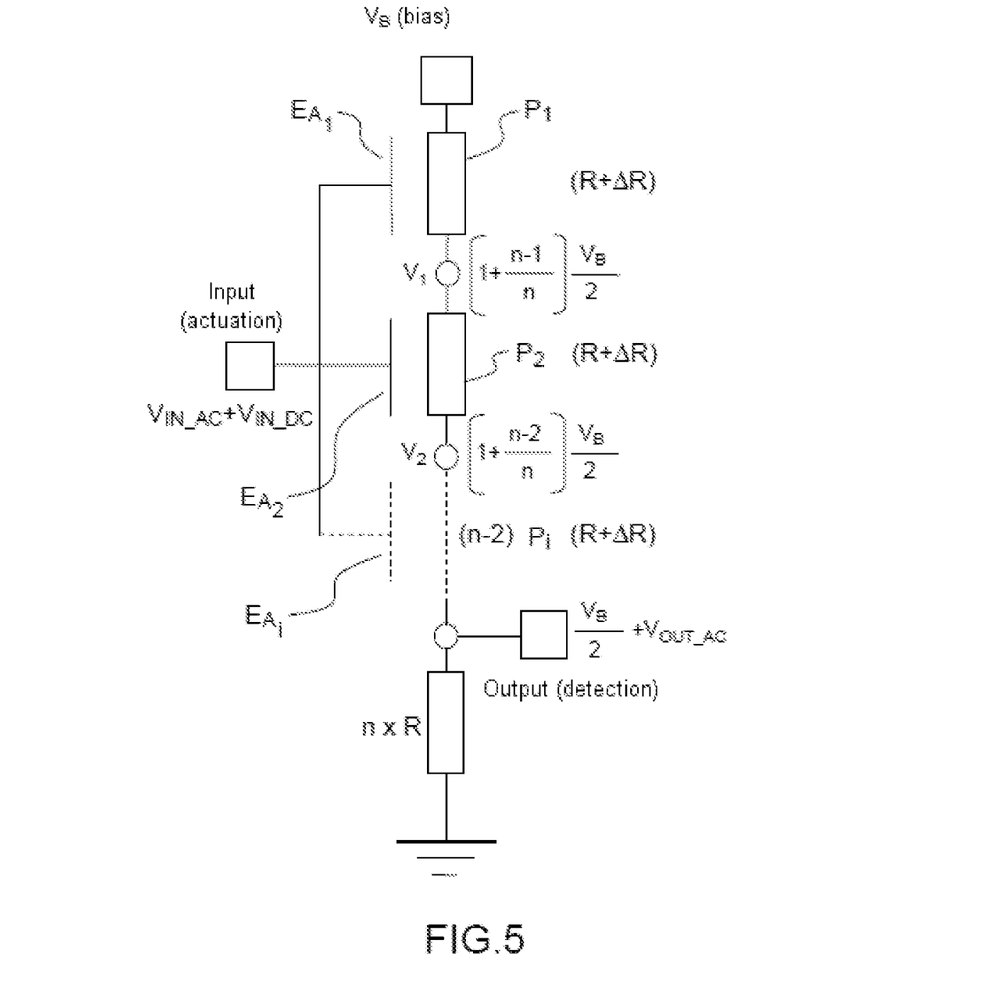
FIG. 5 illustrates the schematic of a first example variant of the invention in which the n resonators are fixed-end beams with piezoresistive detection means.

By way of example, FIG. 5 illustrates one embodiment of the invention with $V_{B2}$=0 and with a network of n resonators Pi incorporating piezoresistive gauges or being coupled to piezoresistive gauges (not shown) and electrically connected in series between the potential $V_B$ and ground. This array of resonators may advantageously be mounted in series with a single biasing resistor or a set of resistors, having a total resistance of n×R, allowing the piezoresistive detection to be achieved via measurement of variations in the resistance of the whole of the network. The detection output potential is then: $V_B/2+V_{OUT\_AC}$. The choice of the resistance n×R of the biasing resistor allows the voltage gain of the network of resonators to be optimized. This configuration is equivalent to a conventional half-Wheatstone bridge configuration.

According to this example, n resonators are actuated by controller electrodes $E_{Ai}$ connected to a common input potential $V_{IN\_AC}+V_{IN\_DC}$.

The resonators according to this example may typically be of the same type as those described in patent application FR 2 917 731.

Second Example Device According to the Invention

Figure 6:
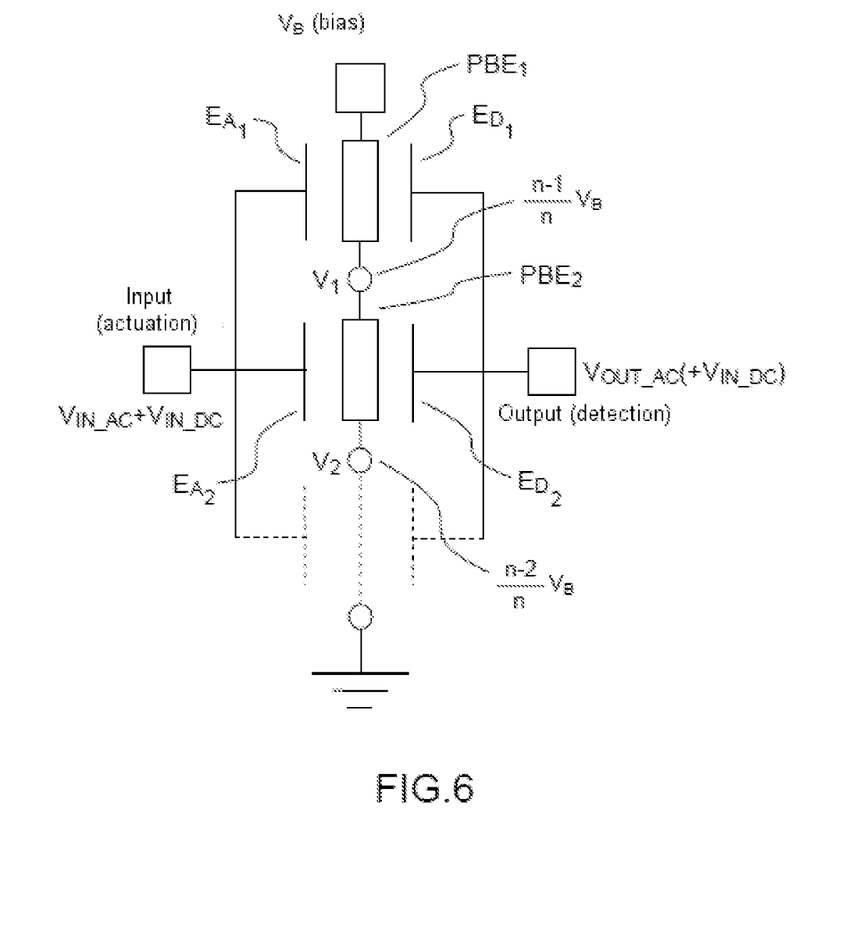
FIG. 6 illustrates the schematic of a second example variant of the invention in which the n resonators are fixed-end beams with capacitive detection means employing a 3-port mode.

FIG. 6 illustrates one embodiment of the invention with a network of fixed-end beams employing 3-port mode capacitive detection, the three ports being: an actuation electrode, a biasing electrode and a detection electrode. It is preferable to apply to the latter the voltage $V_{IN\_DC}$ (the same applied to the input electrode) in order to equalize the DC voltages exerted by the two electrodes on the beam.

More precisely, according to this variant the device comprises a set of actuation electrodes $E_{Ai}$, an array of fixed-end beams PBEi and a set of detection electrodes $E_{Di}$.

The fixed-end beams are interconnected to one another in series.

Third Example Device According to the Invention

Figure 7:
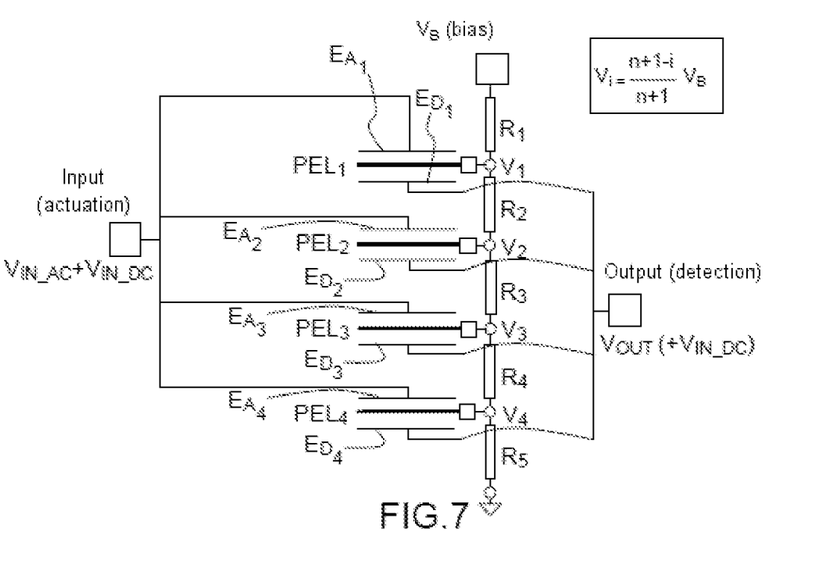
FIG. 7 illustrates the schematic of a third example variant of the invention in which the n resonators are cantilever beams with capacitive detection means.

According to this example, which is illustrated in FIG. 7, the beams are cantilever beams i.e. beams that are fixed only at one of their ends and not fixed at both their ends as in the example illustrated in FIG. 6. FIG. 7 schematically shows one example with 4 beams PEL1, PEL2, PEL3 and PEL4, coupled to 4 actuation electrodes $E_{A1}$, $E_{A2}$, $E_{A3}$ and $E_{A4}$; FIG. 7 also shows elements R1, R2, R3, R4 and R5 (corresponding to resistors present between the various nodes of potentials Vi) and the potentials along the series of said cantilever beams mounted in series. By way of output, 4 electrodes $E_{D1}$, $E_{D2}$, $E_{D3}$ and $E_{D4}$ dedicated to detection are connected to a common output potential, the AC portion of which is $V_{OUT}$ (the detection signal), the DC portion advantageously being fixed at $V_{IN\_DC}$ (in order to equalize the DC voltage exerted by the two types of electrodes on the beam).

Example of Implementation of the Invention with a Network of Plate Resonators Employing Capacitive Detection The device comprises plate resonators employing capacitive detection and electrostatically actuated in a Lame mode (the structures being mechanically anchored at their four corners). These resonators are advantageous because they easily allow a resonant frequency of about one hundred MHz to be achieved.

Figure 8:
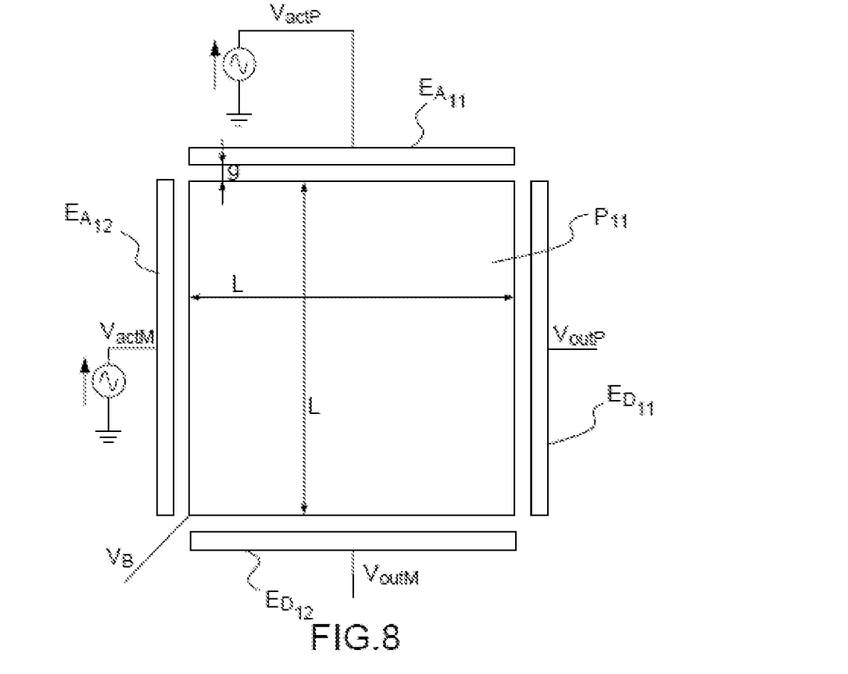
FIG. 8 illustrates a diagram of an electrostatically actuated plate resonator employing capacitive detection, used in one example embodiment of the present invention.
Figure 9:
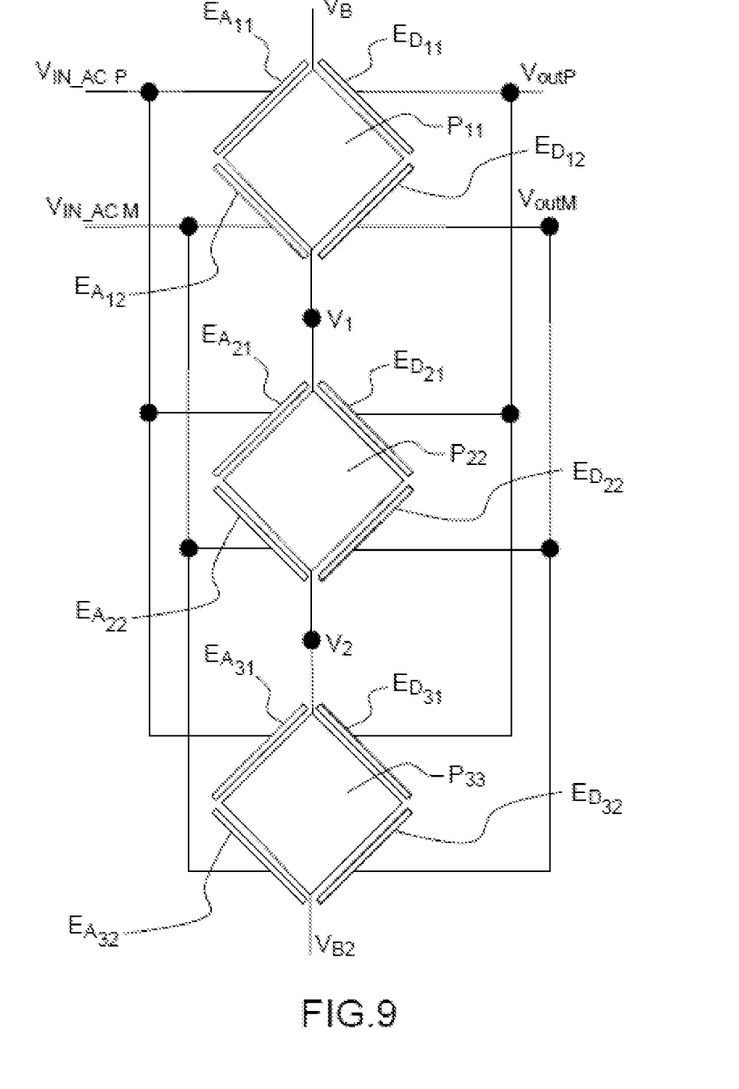
FIG. 9 illustrates a diagram of a network of 3 plate resonators mounted in series, such as that shown in FIG. 8.

FIG. 8 illustrates a (square) plate resonator P11 having the following dimensions: side length L and thickness h. It is made to move using two electrostatic actuation electrodes to which AC voltages $V_{IN\_AC\_P}(t)$ and $V_{IN\_AC\_M}(t)=-V_{IN\_AC\_P}(t)$ are applied to each of the electrodes $E_{A11}$ and $E_{A12}$ as indicated in FIG. 8, or as in FIG. 9 ($E_{A11}$, $E_{A21}$, $E_{A31}$ and $E_{A12}$, $E_{A22}$, $E_{A32}$) which illustrates a device of the invention in which three plates P11, P22 and P33 are electrically connected in series.

This gives: $\Delta V_{IN\_AC}(t)=V_{IN\_AC\_P}(t)-V_{IN\_AC\_M}(t)$ and $V_{DC}$ the DC actuation voltage of the plate (in the present example, using the same notations as in the preceding examples, $V_{DC}=-V_B$).

The movement of this plate is then measured by virtue of two other electrodes using a capacitive transduction. The voltages measured on the detection electrodes are designated $V_{OUT\_P}(t)$ and $V_{OUT\_M}(t)$.

This gives $\Delta V_{OUT}(t)=V_{OUT\_P}(t)-V_{OUTM}(t)$.

These pairs of detection electrodes are respectively referenced in FIG. 8: $E_{D11}$ and $E_{D12}$; and in FIG. 9: $E_{D11}$ and $E_{D12}$, $E_{D21}$ and $E_{D22}$ and $E_{D31}$ and $E_{D32}$.

On the basis for example of the publication by the authors J. Arcamone, E. Colinet, A. Niel, E. Ollier, "Efficient capacitive transduction of high-frequency micromechanical resonators by intrinsic cancellation of parasitic feedthrough capacitances", APPLIED PHYSICS LETTERS 97, 043505 (2010), it is possible to demonstrate that the transfer function of this resonator is:

$$\Delta \ddot{v}_{OUT} + \frac{2\pi f_0}{2Q}\Delta \dot{v}_{OUT} + (2\pi f_0)^2\left(1 - \frac{V_B^2}{V_{softening}^2}\right)\Delta v_{OUT} = 2\frac{\varepsilon_0 hL}{g^2}V_B \Delta v_{INAC}$$

where:

$\Delta \ddot{v}_{OUT}$ is the second time derivative;

$\Delta \dot{v}_{OUT}$ is the first time derivative; and $\varepsilon_0$ is the dielectric permittivity of vacuum.

The term $V_{softening}$ is equal to $$\sqrt{\frac{k_{EFF}g^3}{2\varepsilon_0 hL}}$$

where $k_{EFF}$ is the effective stiffness of the plate.

In the present example, the DC actuation voltage $V_{IN\_DC}$ is set to 0, and the DC potential difference ($V_{DC}$) between the resonator and the actuation electrode is therefore $V_{DC}=V_B$.

The term $$\frac{V_B^2}{V_{softening}^2}$$

expresses the spring-softening effect described above in the present application. It is responsible for the variation in resonant frequency with the effective DC biasing voltage $V_{DC}$. It is also the effect that is used in the present invention in order to modify the passband of the band-pass filter produced using this network of MEMS.

In the case of a network of n=10000 plate resonators, Table 1 below collates the various geometrical and electrical parameters:

| | | | |
|---|---|---|---|
| Plate thickness | h = 3 µm | DC biasing voltage | $V_B$ = 15 V |
| Plate length | L = 41.25 µm | Output resistance of the network | $R_{load}$ = 50 Ω |
| Plate/electrode gap | g = 80 nm | Output capacitance of the network | $C_{load}$ = 100 pF |
| Quality factor | Q = 10000 | | |

The voltage on each node between two separate resonators is:

$$V_i = V_{B2} + \frac{n-1}{n}\Delta V_B \text{ where } \Delta V_B = V_B - V_{B2}.$$

The effective actuation voltage seen by a resonator of index i may be approximated by:

$$V_{DC}(i) = V_{INDC} - V_{B2} - \frac{2n-2i+1}{2n}\Delta V_B$$

The voltage gain G of the network may then be expressed in the following way:

$$G(f) = \frac{1}{\underbrace{1/R_{load} + j2\pi f(C_{load} + n\varepsilon_0 hL/g)}_{\text{Load seen by the network}}}$$

$$\underbrace{\left|\sum_{i=1}^{n}\frac{1}{2\pi f_{Ri}m}\frac{[\varepsilon_0 hLV_i/g^2]^2}{1 + jf/Qf_{Ri} - (jf/Qf_{Ri})^2}\right|}_{\text{Current generated by the network}}$$

where m is the mass of the plate and $f_{Ri}$ the resonant frequency of the resonator of index i.

Figure 10:
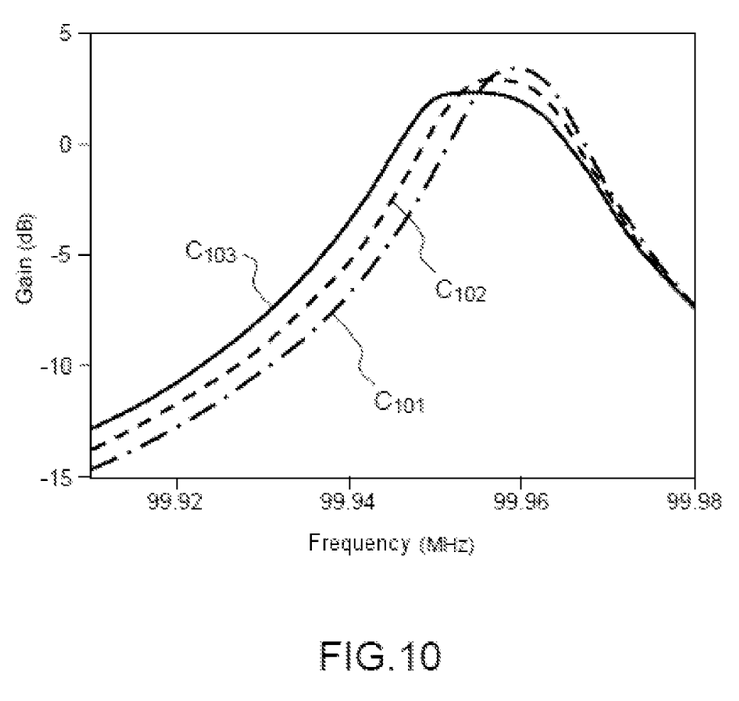
FIG. 10 illustrates the gain of a network of 10000 plate resonators for various potential differences $\Delta V_B$ applied to the series of 10000 plate resonators.

FIG. 10 shows the gain of the network with 10000 plate resonators for various biasing voltages, the curve $C_{101}$ relates to a $\Delta V_B$=3V, the curve $C_{102}$ relates to a $\Delta V_B$=4V, and the curve $C_{103}$ relates to a $\Delta V_B$=5V.

This figure illustrates the fact that the network behaves like a band-pass filter, the central frequency and passband of which are adjustable via simple and controllable means.

The invention claimed is:

1. A MEMS/NEMS device having an adjustable frequency response and comprising:

an array of electrostatically actuated resonators, an electrostatic actuation circuit for actuating said array of electrostatically actuated resonators, electrical detection means, and means for adjusting a frequency response of all of said array of electrostatically actuated resonators;

at least one network of n resonators in the array of electrostatically actuated resonators having a movable portion, said n resonators being electrically connected in a series between a first biasing potential $V_B$ and a second biasing potential $V_{B2}$, each $i^{th}$ resonator being biased to a potential Vi between said potential $V_B$ and said potential $V_{B2}$, depending on a position of said $i^{th}$ resonator in the series, 1≤i≤n, i and n being integers;

said electrostatic actuation circuit for actuating said resonators includes, for each said $i^{th}$ resonator, an actuation electrode facing said movable portion of the $i^{th}$ resonator, all of said actuation electrodes being connected in parallel to a common control potential $V_{IN}$, an actuation voltage of each $i^{th}$ resonator being equal to $V_{IN}$-Vi;

said detection means includes a detection output common to all said n resonators, said detection output being connected to an output potential $V_{out}$; and said means for adjusting the frequency response being configured to vary said common control potential and/ or at least one of the first and the second biasing potentials $V_B$ and $V_{B2}$, respectively.

2. The MEMS/NEMS device having an adjustable frequency response and comprising electrostatically actuated resonators according to claim 1, in which the detection means are capacitive detection means comprising a set of detection electrodes coupled to the n resonators, said detection electrodes being connected to said output potential $V_{out}$.

3. The MEMS/NEMS device having an adjustable frequency response and comprising electrostatically actuated resonators according to claim 1, in which the detection means are piezoresistive detection means, of the resistivity of the array of n resonators connected in series.

4. The MEMS/NEMS device having an adjustable frequency response and comprising electrostatically actuated resonators according to claim 1, in which the resonators are cantilever beams.

5. The MEMS/NEMS device having an adjustable frequency response and comprising electrostatically actuated resonators according to claim 1, in which the resonators are fixed-end beams.

6. The MEMS/NEMS device having an adjustable frequency response and comprising electrostatically actuated resonators according to claim 1, in which the resonators are plate resonators.

7. The MEMS/NEMS device having an adjustable frequency response and comprising electrostatically actuated resonators according to claim 6, comprising pairs of actuation electrodes and pairs of detection electrodes that are coupled to each plate resonator, each plate resonator being able to be actuated in a Lamé mode.

8. The MEMS/NEMS device having an adjustable frequency response and comprising electrostatically actuated resonators according to claim 1, in which the n resonators have a stiffness and a gap with the associated actuation electrode, defining a DC actuation voltage for each resonator by an equation $V_{DC}(i)=V_{IN\ DC}-Vi$, such that the average of all the actuation voltages $M\ [V_{DC}(i)]$, with i varying from 1 to n, is substantially equal to the value $n \times \sigma[V_{DC}(i)]$, where $\sigma[V_{DC}(i)]$ is the standard deviation of said actuation voltages.

9. The MEMS/NEMS device having an adjustable frequency response according to claim 1, in which the n resonators have identical or almost identical geometrical dimensions.

10. An RF filter having an adjustable frequency response and comprising a MEMS/NEMS device according to claim 1.

11. A sensor for detecting frequency variations, comprising a MEMS/NEMS device according to claim 1.

12. A sensor for detecting mass, comprising a MEMS/NEMS device according to claim 1.

13. A sensor for detecting gases, comprising a MEMS/NEMS device according to claim 1.

* * * * *